US012593532B2

(12) United States Patent
Tong et al.

(10) Patent No.: US 12,593,532 B2
(45) Date of Patent: Mar. 31, 2026

(54) BACK CONTACT SOLAR CELL AND METHOD FOR MANUFACTURING SAME

(71) Applicant: LONGI GREEN ENERGY TECHNOLOGY CO., LTD., Xi'an (CN)

(72) Inventors: Hongbo Tong, Xi'an (CN); Zhenguo Li, Xi'an (CN); Qingping Liu, Xi'an (CN); Chao Ding, Xi'an (CN); Chen Chen, Xi'an (CN); Guangbin Dong, Xi'an (CN); Jinhua He, Xi'an (CN); Hongchao Zhang, Xi'an (CN); Long Yu, Xi'an (CN); Xinxing Xu, Xi'an (CN)

(73) Assignee: LONGI GREEN ENERGY TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 19/051,792

(22) Filed: Feb. 12, 2025

(65) Prior Publication Data

US 2025/0248168 A1 Jul. 31, 2025

Related U.S. Application Data

(63) Continuation-in-part of application No. PCT/CN2024/125569, filed on Oct. 17, 2024.

(30) Foreign Application Priority Data

Jan. 26, 2024 (CN) .......................... 202410111962.8

(51) Int. Cl.
| | | |
|---|---|---|
| *H10F 77/70* | (2025.01) | |
| *H10F 10/14* | (2025.01) | |
| *H10F 71/00* | (2025.01) | |

(52) U.S. Cl.
CPC ......... *H10F 77/707* (2025.01); *H10F 10/146* (2025.01); *H10F 71/1221* (2025.01)

(58) Field of Classification Search
CPC ... H10F 77/707; H10F 10/146; H10F 71/1221
See application file for complete search history.

(56) References Cited

U.S. PATENT DOCUMENTS

| | | | |
|---|---|---|---|
| 11,489,080 B1 | 11/2022 | Chen et al. | |
| 2010/0206369 A1 | 8/2010 | Kim et al. | |

(Continued)

FOREIGN PATENT DOCUMENTS

| | | |
|---|---|---|
| CN | 103875082 A | 6/2014 |
| CN | 106684160 A | 5/2017 |

(Continued)

OTHER PUBLICATIONS

Machine translation of KR-20150049211-A, Shim Kyung Jin. (Year: 2015).*

(Continued)

*Primary Examiner* — Mayla Gonzalez Ramos

(74) *Attorney, Agent, or Firm* — Fish & Richardson P.C.

(57) ABSTRACT

This disclosure provides a back contact solar cell and a method for manufacturing a back contact solar cell. In one example, a back contact solar cell includes a silicon substrate having first regions and second regions alternately distributed on a back surface of the silicon substrate, and a first doped semiconductor layer formed on a first region on the back surface of the silicon substrate. A groove structure (Continued)

concaving inward the silicon substrate relative to a surface of the first region is formed on a second region. An end portion of the first doped semiconductor layer adjacent to the second region is arranged in a suspended manner.

11 Claims, 7 Drawing Sheets

(56)                    References Cited

U.S. PATENT DOCUMENTS

| | | | |
|---|---|---|---|
| 2011/0303280 | A1 | 12/2011 | Pawlak et al. |
| 2018/0323328 | A1 | 11/2018 | Kim et al. |
| 2022/0393043 | A1 | 12/2022 | Qiu et al. |
| 2022/0393052 | A1 | 12/2022 | Qiu et al. |

FOREIGN PATENT DOCUMENTS

| | | |
|---|---|---|
| CN | 110838536 A | 2/2020 |
| CN | 112864275 A | 5/2021 |
| CN | 114765224 A | 7/2022 |
| CN | 116314400 A | 6/2023 |
| CN | 116417523 A | 7/2023 |
| CN | 117637875 A | 3/2024 |
| CN | 117637876 A | 3/2024 |
| DE | 202023107467 U1 | 1/2024 |
| KR | 1020100092746 A | 8/2010 |
| KR | 1020150049211 A | 5/2015 |
| TW | 201401531 A | 1/2014 |
| WO | WO 2013125036 A1 | 8/2013 |

OTHER PUBLICATIONS

Machine translation of CN-110838536-A, Bao, Jie. (Year: 2020).*
International Search Report and Written Opinion in International Appln. No. PCT/CN2024/125569, mailed on Jan. 6, 2025, 12 pages (with machine translation).
Mat Desa et al.,"Silicon back contact solar cell configuration: A pathway towards higher efficiency," Renewable and Sustainable Energy Reviews, Jul. 2016, 60:1516-1532.
Office Action in Australian Appln. No. 2024335458, dated Apr. 17, 2025, 9 pages.
Search Report in Chinese Appln. No. 202410111962.8, available no later than Jan. 26, 2024, 5 pages (with machine translation).
Search Report in Chinese Appln. No. 202410111962.8, dated Mar. 13, 2024, 3 pages (with English translation).
Extended European Search Report in European Appln. No. 24861371. 3, mailed on Jan. 28, 2026, 10 pages.

\* cited by examiner

BACK CONTACT SOLAR CELL AND METHOD FOR MANUFACTURING SAME

CROSS-REFERENCE TO RELATED APPLICATIONS

This application is a continuation-in-part application of PCT application No. PCT/CN2024/125569, filed on Oct. 17, 2024, which claims priority to Chinese Patent Application No. 202410111962.8 field on Jan. 26, 2024, the disclosure of the aforementioned applications are hereby incorporated by reference in their entireties.

TECHNICAL FIELD

This application relates to the field of photovoltaic technologies, and in particular, to a back contact solar cell and a method for manufacturing the same.

BACKGROUND

A back contact solar cell is a solar cell in which no electrode is arranged on a light receiving surface of a cell and positive and negative electrodes are all arranged on a back surface of the cell, so that blocking of the electrodes to the cell is reduced, a short-circuit current of the cell can be increased, and the energy conversion efficiency of the cell can be improved.

However, in the related art, the light utilization on the back surface of the back contact solar cell is reduced, which is not conducive to improving the photoelectric conversion efficiency of the back contact solar cell.

SUMMARY

An objective of this application is to provide a back contact solar cell and a method for manufacturing the same, to increase the light utilization on a back surface of a back contact solar cell, which is conducive to improving the photoelectric conversion efficiency of the back contact solar cell.

To achieve the foregoing objective, according to a first aspect, this application provides a back contact solar cell, including: a silicon substrate, and a first doped semiconductor layer formed on a partial region on a back surface of the silicon substrate. A region corresponding to the first doped semiconductor layer in the back surface of the silicon substrate is defined as a first region, and a remaining region is defined as a second region. The first region and the second region are alternately distributed. A groove structure concaving inward into the silicon substrate relative to a surface of the first region is formed on the second region. An end portion of the first doped semiconductor layer adjacent to the second region is arranged in a suspended manner.

In a case that the foregoing technical solution is used, when the back contact solar cell provided in this application is in an operating state, light is refracted from a light receiving surface into the silicon substrate along a direction from the light receiving surface to the back surface. The silicon substrate can generate electrons and holes after absorbing photon energy. In addition, the electrons and the holes move toward the first doped semiconductor layer and a part of the second region respectively and finally led out by corresponding electrodes, to form a photo-current. The light entering the silicon substrate cannot be completely absorbed and used by the silicon substrate, and a part of the light is refracted out from the back surface of the silicon substrate. In this case, the end portion of the first doped semiconductor layer located on the back surface of the silicon substrate and adjacent to the second region is arranged in a suspended manner. In this case, the part of light refracted out from the back surface of the silicon substrate may go back into the silicon substrate and be absorbed and used by the silicon substrate when being reflected by the end portion that is of the first doped semiconductor layer adjacent to the second region and arranged in a suspended manner, so that the light utilization of the back contact solar cell may be increased, which is conducive to improving the photoelectric conversion efficiency of the back contact solar cell.

In addition, in the back contact solar cell provided in this application, the groove structure concaving inward into the silicon substrate relative to the surface of the first region is formed on the second region of the back surface of the silicon substrate, so that the surface of the first region and a surface of the second region can be staggered along a thickness direction of the silicon substrate, which is conducive to at least partially staggering the first doped semiconductor layer and a corresponding doped region located in the second region (or a second doped semiconductor layer formed on the second region) that are both located on the back surface of the silicon substrate and have opposite conductivity types along the thickness direction of the silicon substrate, thereby reducing a current leakage risk on the back surface and improving the electrical reliability of the back contact solar cell.

In a possible implementation, a depth of the groove structure is greater than or equal to 200 nm and less than or equal to 2500 nm.

In a case that the foregoing technical solution is used, during an actual manufacturing process, after the groove structure concaving inward into the silicon substrate relative to the surface of the first region is formed on the second region on the back surface of the silicon substrate, the end portion of the first doped semiconductor layer adjacent to the second region may be arranged in a suspended manner. Based on this, when the depth of the groove structure falls within the foregoing range, a weak reflection effect of the end portion to light caused by a small suspension height corresponding to the end portion of the first doped semiconductor layer adjacent to the second region due to a small depth can be prevented, which is conducive to enabling more light to go back into the silicon substrate under the reflection effect of the end portion of the first doped semiconductor layer adjacent to the second region, thereby ensuring high light utilization of the back contact solar cell. In addition, a small staggering degree between the first doped semiconductor layer and the corresponding doped region located in the second region (or the second doped semiconductor layer formed on the second region) that are both located on the back surface of the silicon substrate and have opposite conductivity types along the thickness direction of the silicon substrate due to a small groove may also be prevented, further reducing a current leakage risk on the back surface. In addition, a decrease in a suspension length of the end portion on the second region caused by an impact of an etching solution etching the silicon substrate on the end portion of the first doped semiconductor layer due to a large depth of the groove structure may also be prevented, thereby ensuring that more light may go back into the silicon substrate under the reflection effect of the end portion that is of the first doped semiconductor layer adjacent to the second region and has a large length. Further, a requirement for usage of a silicon substrate with a large thickness due to a large depth of the groove structure may also be prevented, thereby helping implement production of a thin back contact solar cell while reducing manufacturing costs of the back contact solar cell.

In a possible implementation, along an arrangement direction of the first region and the second region, a length of the end portion arranged in a suspended manner in the first doped semiconductor layer is greater than 0 and less than or equal to 3000 nm.

In a case that the foregoing technical solution is used, it may be understood that, a longer end portion arranged in a suspended manner in the first doped semiconductor layer indicates a larger coverage length of the end portion on the second region. Two doped regions with opposite conductivity types are arranged on the back surface of the back contact solar cell, so that along the arrangement direction of the first region and the second region, when the length of the end portion arranged in a suspended manner in the first doped semiconductor layer falls within the foregoing range, current leakage easily caused by a small gap between the first doped semiconductor layer and the corresponding doped region located in the second region (or the second doped semiconductor layer formed on the second region) due to a large length of the end portion arranged in a suspended manner in the first doped semiconductor layer may be prevented, thereby ensuring high electrical reliability of the back contact solar cell. In addition, when the length of the end portion arranged in a suspended manner in the first doped semiconductor layer is greater than 0 and less than or equal to 3000 nm, the length of the end portion arranged in a suspended manner has a large optional range, which is conducive to reducing the difficulty in manufacturing a first doped semiconductor layer with a fixed length, and may also improve the applicability of the back contact solar cell provided in this application in different application scenarios.

In a possible implementation, at least a partial surface in a side wall of the groove structure is arranged obliquely relative to a horizontal plane, to cause a cross-sectional area of at least a partial region of the groove structure to gradually increase along a direction from a light receiving surface to the back surface; In this case, an area of a groove bottom of the groove structure is less than an area of a groove opening thereof, which is conducive to increasing a gap between the first doped semiconductor layer and the corresponding doped region that has a conductivity type opposite to that of the first doped semiconductor layer and located in the second region (or the second doped semiconductor layer formed on the second region) along the arrangement direction of the first region and the second region, thereby reducing a current leakage risk on the back surface of the back contact solar cell and ensuring high electrical reliability of the back contact solar cell. In addition, the part arranged obliquely relative to the horizontal plane in the side wall of the groove structure also helps reflect light, thereby further reducing a probability that the light is refracted out from the back surface of the back contact solar cell, which is further conducive to improving the photoelectric conversion efficiency of the back contact solar cell.

In a possible implementation, in the side wall of the groove structure, a partial surface close to a groove opening is arranged perpendicular to the horizontal plane. In this case, another possible implementation is provided for a morphology of the groove structure in the back contact solar cell provided in this application, which is conducive to improving the applicability of the back contact solar cell provided in this application in different application scenarios.

In a possible implementation, an angle between the part arranged obliquely relative to the horizontal plane in the side wall of the groove structure and the horizontal plane is greater than or equal to 52° and less than or equal to 58°.

In a case that the foregoing technical solution is used, when the angle between the part arranged obliquely relative to the horizontal plane in the side wall of the groove structure and the horizontal plane falls within the foregoing range, a weak effect of the part arranged obliquely relative to the horizontal plane in the side wall of the groove structure in reflecting light back into the silicon substrate caused by a large or small angle may be prevented, thereby ensuring that more light can go back into the silicon substrate and be reused by the silicon substrate under a strong reflection effect of the part arranged obliquely relative to the horizontal plane in the side wall of the groove structure, and further improving the light utilization of the back contact solar cell.

In a possible implementation, in the side wall of the groove structure, a planar surface arranged parallel to the horizontal plane exists between the partial surface close to the groove opening and a partial surface close to a groove bottom. In this case, the side wall of the groove structure includes two surfaces at least having different arrangement angles relative to the horizontal plane, which is conducive to reflection of different parts in the side wall of the groove structure to light at different angles, and is further conducive to enabling more light to go back into the silicon substrate and be reused by the silicon substrate under a reflection effect of the side wall of the groove structure.

In a possible implementation, along an arrangement direction of the first region and the second region, a length of the planar surface arranged parallel to the horizontal plane in the side wall of the groove structure is greater than 0 and less than 2 μm.

In a case that the foregoing technical solution is used, within a specific range, along the arrangement direction of the first region and the second region, the length of the planar surface arranged parallel to the horizontal plane in the side wall of the groove structure is in direct proportion to an etching time corresponding to the groove structure. Based on this, when the length of the planar surface arranged parallel to the horizontal plane in the side wall of the groove structure falls within the foregoing range, a long etching time corresponding to the groove structure caused by a large length may be prevented, thereby ensuring a specific length of the end portion that is of the first doped semiconductor layer adjacent to the second region and arranged in a suspended manner after the groove structure is formed.

In a possible implementation, along the arrangement direction of the first region and the second region, a minimum distance between the planar surface arranged parallel to the horizontal plane in the side wall of the groove structure and the groove opening of the groove structure is greater than 0 and less than 1 μm. In this case, a poor reflection cooperation effect between the planar surface and the end portion arranged in a suspended manner in the first doped semiconductor layer caused by a large gap between the planar surface arranged parallel to the horizontal plane in the side wall of the groove structure and the groove opening of the groove structure along the arrangement direction of the first region and the second region may be prevented, thereby ensuring that more light can be reflected back into the silicon substrate under a joint effect of the planar surface and the end portion arranged in a suspended manner, and further improving the light utilization of the back contact solar cell.

In a possible implementation, at least a partial surface of a groove bottom of the groove structure is a textured surface. In this case, the textured surface has an uneven surface feature, when the whole surface of the groove bottom of the groove structure is a textured surface, a surface area of a corresponding doped region (or the second doped semiconductor layer) formed at the groove bottom of the groove structure may be increased, so that a contact area between the corresponding doped region (or the second doped semiconductor layer) and an electrode may be further increased, thereby reducing contact resistance and helping improve the photoelectric conversion efficiency of the back contact solar cell. In addition, when a partial surface of the groove bottom of the groove structure exposed outside a second passivation layer and the second doped semiconductor layer that are stacked is a textured surface, the partial surface may include a specific light trapping effect, so that more light can be transmitted into the silicon substrate through the groove bottom of the groove structure. Besides, the second passivation layer is formed on a planar part of the groove bottom, so that a passivation effect of the second passivation layer on the partial surface may be improved, to improve the photoelectric conversion efficiency of the back contact solar cell.

In a possible implementation, the back contact solar cell further includes a first passivation layer located between the first region and the first doped semiconductor layer.

In a case that the foregoing technical solution is used, the first passivation layer and the first doped semiconductor layer may form a selective contact structure to perform chemical passivation on a corresponding region on the back surface of the silicon substrate and selectively collect carriers of a corresponding conductivity type, thereby reducing a carrier recombination rate on the back surface and helping improve the photoelectric conversion efficiency of the back contact solar cell.

In a possible implementation, the back contact solar cell further includes a second doped semiconductor layer formed on a groove bottom of the groove structure, and a conductivity type of the second doped semiconductor layer is opposite to a conductivity type of the first doped semiconductor layer.

In a possible implementation, in a case that the back contact solar cell includes the first passivation layer and the first passivation layer is a tunneling passivation layer, the first doped semiconductor layer is a doped polysilicon layer.

In a possible implementation, in a case that the back contact solar cell includes the second doped semiconductor layer, the back contact solar cell further includes a second passivation layer located between the silicon substrate and the second doped semiconductor layer.

In a possible implementation, in a case that the back contact solar cell includes the second doped semiconductor layer, along an arrangement direction of the first region and the second region, a gap between the first doped semiconductor layer and the second doped semiconductor layer is greater than or equal to 20 μm and less than or equal to 110 μm.

In a case that the foregoing technical solution is used, when the gap between the first doped semiconductor layer and the second doped semiconductor layer that have opposite conductivity types falls within the foregoing range, current leakage between the first doped semiconductor layer and the second doped semiconductor layer caused by a small gap can be prevented, thereby ensuring high electrical reliability of the back contact solar cell. In addition, it can also be prevented that carriers on the back surface cannot be collected by the first doped semiconductor layer and/or the second doped semiconductor layer in time and led out by corresponding electrodes due to a large gap, thereby further reducing the carrier recombination rate on the back surface.

In a possible implementation, the second passivation layer is a tunneling passivation layer, and the second doped semiconductor layer is a doped polysilicon layer.

According to a second aspect, this application further provides a method for manufacturing a back contact solar cell, and the method for manufacturing a back contact solar cell includes the following steps: providing a silicon substrate; forming a doped semiconductor material layer entirely arranged on a back surface of the silicon substrate and a mask layer located on a part of the doped semiconductor material layer; selectively etching the doped semiconductor material layer using the mask layer, to forming a remaining part of the doped semiconductor material layer into a first doped semiconductor layer, where a region corresponding to the first doped semiconductor layer in the back surface of the silicon substrate is defined as a first region, and a remaining region is defined as a second region; and the first region and the second region are alternately distributed; and forming, using the mask layer, a groove structure concaving inward into the silicon substrate relative to a surface of the first region on the second region, to cause an end portion of the first doped semiconductor layer adjacent to the second region to be arranged in a suspended manner.

In a possible implementation, a material of the first doped semiconductor layer includes silicon. In addition, the step of forming a doped semiconductor material layer entirely arranged on a back surface of the silicon substrate and a mask layer located on a part of the doped semiconductor material layer includes the following steps: forming an intrinsic semiconductor material layer entirely arranged on the back surface of the silicon substrate; performing doping treatment on the intrinsic semiconductor material layer, to form the intrinsic semiconductor material layer into the doped semiconductor material layer, and forming a doped silicate glass layer entirely arranged on the doped semiconductor material layer; performing heat treatment on a part of the doped silicate glass layer by using a laser etching process, to form a part of the doped silicate glass layer on which the heat treatment is not performed into the mask layer; and removing the part of the doped silicate glass layer on which the heat treatment is performed.

In a case that the foregoing technical solution is used, when the material of the first doped semiconductor layer includes silicon, a material of the intrinsic semiconductor material layer for manufacturing the doped semiconductor material layer also includes silicon. Based on this, after doping treatment is performed on the intrinsic semiconductor material layer, not only the doped semiconductor material layer can be obtained, but also the doped silicate glass layer entirely arranged can be formed on the doped semiconductor material layer. Heat treatment is then performed on a part of the doped silicate glass layer by using the laser etching process. In this case, the part of the doped silicate glass layer on which laser treatment is performed has poor density and is easy to remove. A part of the doped silicate glass layer on which the laser treatment is not performed has high density and is not easy to remove. Therefore, after the heat treatment, different parts of the doped silicate glass layer have different etching selection ratios, and when the mask layer for patterning the doped semiconductor material layer is obtained, there is no need to additionally form other mask materials and other mask deposition processes to obtain the mask layer, thereby helping reduce the manufacturing costs of the back contact solar cell and simplifying a manufacturing procedure of the back contact solar cell.

In a possible implementation, the groove structure concaving inward into the silicon substrate relative to the surface of the first region is formed on the second region by using a wet chemical process and using the mask layer, where a process temperature of the wet chemical process is greater than or equal to 65° C. and less than or equal to 85° C. and/or a process time of the wet chemical process is greater than or equal to 50 s and less than or equal to 500 s.

In a case that the foregoing technical solution is used, both the process temperature and the process time of the wet chemical process affect a specification of the groove structure formed through the wet chemical process and a specification of the end portion arranged in a suspended manner in the first doped semiconductor layer. Based on this, when the process temperature of the wet chemical process falls within the foregoing range, a small depth of the groove structure and a small suspension height and a small length of the end portion arranged in a suspended manner in the first doped semiconductor layer caused by a low process temperature may be prevented. In addition, a large depth of the groove structure caused by a high process temperature may also be prevented. For beneficial effects of preventing a small depth of the groove structure and a small suspension height and a small length of the end portion arranged in a suspended manner in the first doped semiconductor layer and preventing a large depth of the groove structure, reference may be made to the foregoing description. In addition, beneficial effects of the process time falling with the foregoing range are similar to the beneficial effects that the process temperature is greater than or equal to 65° C. and less than or equal to 85° C., and details are not described herein.

In a possible implementation, after the step of providing a silicon substrate and before the step of forming a doped semiconductor material layer entirely arranged on a back surface of the silicon substrate and a mask layer located on a part of the doped semiconductor material layer, the method for manufacturing a back contact solar cell further includes a step: forming a first passivation material layer entirely arranged on the back surface of the silicon substrate; and after the step of selectively etching the doped semiconductor material layer using the mask layer and before the step of forming, using the mask layer, a groove structure concaving inward into the silicon substrate relative to a surface of the first region on the second region, the method for manufacturing a back contact solar cell further includes a step: selectively etching the first passivation material layer using the mask layer, to form a remaining part of the first passivation material layer into a first passivation layer.

In a possible implementation, while the step of forming, using the mask layer, a groove structure concaving inward into the silicon substrate relative to a surface of the first region on the second region is performed, texturing treatment is performed on a groove bottom of the groove structure, to form the groove bottom of the groove structure into a textured surface.

In a possible implementation, after the step of forming, using the mask layer, a groove structure concaving inward into the silicon substrate relative to a surface of the first region on the second region, the method for manufacturing a back contact solar cell further includes a step: forming a second doped semiconductor layer at a groove bottom of the groove structure.

In a possible implementation, after the step of forming, using the mask layer, a groove structure concaving inward into the silicon substrate relative to a surface of the first region on the second region and before the step of forming a second doped semiconductor layer at a groove bottom of the groove structure, the method for manufacturing a back contact solar cell further includes a step: forming a second passivation layer at the groove bottom of the groove structure.

In a possible implementation, the groove bottom of the groove structure formed on the second region using the mask layer is a planar surface; and after the step of forming a second doped semiconductor layer at a groove bottom of the groove structure, texturing treatment is performed on a part of the groove bottom of the groove structure exposed outside the second doped semiconductor layer.

For beneficial effects of the second aspect and various implementations of the second aspect in this application, reference may be made to the analysis of the beneficial effects of the first aspect and various implementations of the first aspect, and details are not described herein.

BRIEF DESCRIPTION OF THE DRAWINGS

The accompanying drawings described herein are used to provide a further understanding of this application, and form a part of this application. Exemplary embodiments of this application and description thereof are used to explain this application, and do not constitute any inappropriate limitation to this application. In the accompanying drawings.

LIST OF REFERENCE NUMERALS

Figure 1:
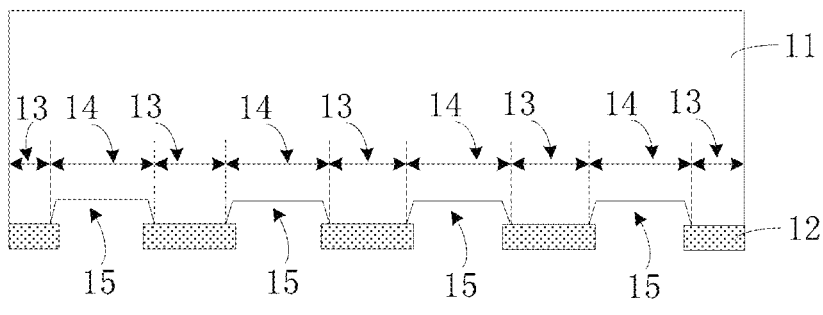
FIG. 1 is a schematic longitudinal cross-sectional view of a first structure of a back contact solar cell according to an embodiment of this application.

11—Silicon substrate, 12—First doped semiconductor layer, 13—First region, 14—Second region, 15—Groove structure, 16—First passivation layer, 17—Second doped semiconductor layer, 18—Second passivation layer, 19—Doped semiconductor material layer, 20—Mask layer, 21—Intrinsic semiconductor material layer, 22—Doped silicate glass layer, and 23—First passivation material layer.

DETAILED DESCRIPTION

Embodiments of the present disclosure are described below with reference to the accompanying drawings. However, it should be understood that, the description is merely exemplary, and is not intended to limit the scope of the present disclosure. In addition, in the following description, description of well-known structures and technologies are omitted, to avoid unnecessarily obscuring the concept of the present disclosure.

The accompanying drawings show various schematic structural diagrams according to the embodiments of the present disclosure. The accompanying drawings are not drawn to scale, some details are enlarged for the purpose of clarity, and some details may be omitted. Shapes of various regions and layers shown in the drawings, and relative sizes and positional relationships between the various regions and layers are merely exemplary, and may deviate in practice due to manufacturing tolerances or technical limitations, and a person skilled in the art may additionally design regions/ layers with different shapes, sizes, and relative positions according to actual requirements.

In the context of the present disclosure, when a layer/ element is referred to as being "on" another layer/element, the layer/element may be directly on the another layer/ element, or an intermediate layer/element may exist between the layer/element and the another layer/element. In addition, if one layer/element is "above" another layer/element in an orientation, when the orientation is turned, the layer/element may be "below" the another layer/element. To make the technical problems to be resolved by, the technical solutions, and the beneficial effects of this application clearer and more comprehensible, the following describes this application in further detail with reference to the accompanying drawings and embodiments. It should be understood that, the specific embodiments described herein are merely used for describing this application and are not intended to limit this application.

In addition, the terms "first" and "second" are used merely for the purpose of description, and shall not be construed as indicating or implying relative importance or implying a quantity of indicated technical features. Therefore, a feature defined by "first" or "second" may explicitly indicate or implicitly include one or more features. In the description of this application, "a plurality of" means two or more, unless otherwise definitely and specifically limited. "Several" means one or more, unless otherwise definitely and specifically limited.

In the description of this application, it should be noted that, unless otherwise explicitly specified and defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, internal communication between two elements, or an interactive relationship between two elements. A person of ordinary skill in the art can understand specific meanings of the terms in this application based on specific situations.

At present, solar cells are increasingly widely used as a new energy alternative solution. A photovoltaic solar cell is an apparatus converting sun's light energy into electric energy. Specifically, the solar cell generates carriers by using the photovoltaic principle, and leads the carriers out by using electrodes, thereby facilitating the effective use of the electric energy. When a positive electrode and a negative electrode included in the solar cell are both located on a back surface of the solar cell, the solar cell is referred to as a back contact solar cell. A front surface of the back contact solar cell is not blocked by any metal electrode, so that the back contact solar cell has a higher short-circuit current Isc and is one of existing technical directions for realizing efficient crystalline silicon solar cells.

Specifically, in the related art, the back contact solar cell at least includes: a silicon substrate, and a first doped semiconductor layer formed on a partial region on a back surface of the silicon substrate. A conductivity type of the first doped semiconductor layer is opposite to a conductivity type of the silicon substrate. Alternatively, a conductivity type of the first doped semiconductor layer is the same as a conductivity type of the silicon substrate. In this case, the back contact solar cell further includes a second doped semiconductor layer formed on a partial region on the back surface of the silicon substrate, and a conductivity type of the second doped semiconductor layer is opposite to the conductivity type of the first doped semiconductor layer. In addition, regardless of a specific structure of the back contact solar cell, two doped regions with opposite conductivity types are arranged on the back surface of the back contact solar cell, and the two doped regions with opposite conductivity types are spaced apart to prevent short circuit.

In an actual manufacturing process of the foregoing back contact solar cell, a doped semiconductor material layer entirely arranged needs to be first formed on the back surface of the silicon substrate, and the doped semiconductor material layer located on a partial region of the back surface is selectively removed to obtain the first doped semiconductor layer. Various parts of the first doped semiconductor layer obtained by using a manufacturing method in the related art are all in contact with the silicon substrate. In this case, after light is refracted into the silicon substrate from a light receiving surface, small part of light that is not used and irradiated between the two doped regions with opposite conductivity types may be reflected and reused by the back surface of the silicon substrate, and most part of the light that is not used and irradiated between the two doped regions with opposite conductivity types may be transmitted through the silicon substrate. That is, most of the light cannot be reflected by the back surface of the silicon substrate into the silicon substrate, leading to a decrease in a reflectivity of the back surface of the back contact solar cell in the related art in reflecting light into the silicon substrate, and further leading to a decrease in the light utilization of the back contact solar cell, which is not conducive to improving the photoelectric conversion efficiency of the back contact solar cell. In addition, in the manufacturing method in the related art, the foregoing doped semiconductor material layer is generally selectively etched by using a laser etching process, and to completely remove a corresponding part of the doped semiconductor material layer, high-temperature laser used may cause damage to the silicon substrate, which is not conducive to improving a yield of the back contact solar cell.

To resolve the foregoing technical problems, according to a first aspect, an embodiment of this application provides a back contact solar cell. As shown in FIG. 1, the back contact solar cell provided in the embodiments of this application includes: a silicon substrate 11, and a first doped semiconductor layer 12 formed on a partial region on a back surface of the silicon substrate 11. A region corresponding to the first doped semiconductor layer 12 in the back surface of the silicon substrate 11 is defined as a first region 13, and a remaining region is defined as a second region 14. The first region 13 and the second region 14 are alternately distributed. A groove structure 15 concaving inward into the silicon substrate 11 relative to a surface of the first region 13 is formed on the second region 14. An end portion of the first doped semiconductor layer 12 adjacent to the second region 14 is arranged in a suspended manner.

In a case that the foregoing technical solution is used, when the back contact solar cell provided in the embodiments of this application is in an operating state, light is refracted from the light receiving surface into the silicon substrate along a direction from the light receiving surface to the back surface. The silicon substrate can generate electrons and holes after absorbing photon energy. In addition, the electrons and the holes move toward the first doped semiconductor layer and a part of the second region respectively and finally led out by corresponding electrodes, to form a photo-current. The light entering the silicon substrate cannot be completely absorbed and used by the silicon substrate, and a part of the light is refracted out from the back surface of the silicon substrate. In this case, as shown in FIG. 1, the end portion of the first doped semiconductor layer 12 located on the back surface of the silicon substrate 11 and adjacent to the second region 14 is arranged in a suspended manner. In this case, the part of light refracted out from the back surface of the silicon substrate 11 may go back into the silicon substrate 11 and be absorbed and used by the silicon substrate 11 when being reflected by the end portion that is of the first doped semiconductor layer 12 adjacent to the second region 14 and arranged in a suspended manner, so that the light utilization of the back contact solar cell may be increased, which is conducive to improving the photoelectric conversion efficiency of the back contact solar cell. In addition, as shown in FIG. 1 and FIG. 2, in the back contact solar cell provided in the embodiments of this application, the groove structure 15 concaving inward into the silicon substrate 11 relative to the surface of the first region 13 is formed on the second region 14 of the back surface of the silicon substrate 11, so that the surface of the first region 13 and a surface of the second region 14 can be staggered along a thickness direction of the silicon substrate 11, which is conducive to at least partially staggering the first doped semiconductor layer 12 and a corresponding doped region located in the second region 14 (or a second doped semiconductor layer 17 formed on the second region 14) that are both located on the back surface of the silicon substrate 11 and have opposite conductivity types along the thickness direction of the silicon substrate 11, thereby reducing a current leakage risk on the back surface and improving the electrical reliability of the back contact solar cell.

In this specification, the end portion that is of the first doped semiconductor layer adjacent to the second region and arranged in a suspended manner may also be referred to as an end portion arranged in a suspended manner in the first doped semiconductor layer, an end portion of the first doped semiconductor layer adjacent to the second region, or an end portion of the first doped semiconductor layer adjacent to the groove structure.

Figure 2:
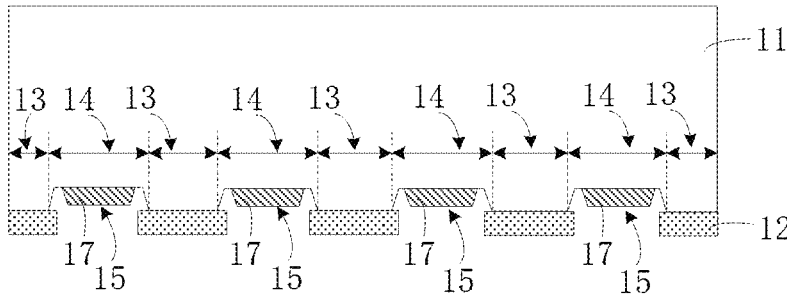
FIG. 2 is a schematic longitudinal cross-sectional view of a second structure of a back contact solar cell according to an embodiment of this application.
Figure 3:
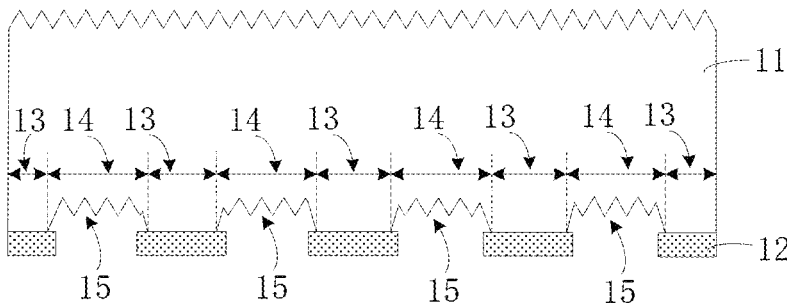
FIG. 3 is a schematic longitudinal cross-sectional view of a third structure of a back contact solar cell according to an embodiment of this application.

In an actual application process, as shown in FIG. 1 and FIG. 2, the light receiving surface of the silicon substrate 11 may be a planar surface. Alternatively, as shown in FIG. 3, the light receiving surface of the silicon substrate 11 may be a textured surface. Because the textured surface has a light trapping effect, when the light receiving surface of the silicon substrate 11 is the textured surface, the reflectivity of the light receiving surface can be reduced, which helps enable more light to be refracted from the light receiving surface into the silicon substrate 11 and be absorbed and utilized by the silicon substrate 11, thereby improving the photoelectric conversion efficiency of the back contact solar cell.

In addition, boundaries of the first region and the second region on the back surface of the silicon substrate are virtual boundaries. As shown in FIG. 1 and FIG. 2, parts other than the end portion adjacent to the second region 14 and arranged in a suspended manner in the first doped semiconductor layer 12 are all located on the first region 13, and the corresponding doped region (or the second doped semiconductor layer 17) having a conductivity type opposite to that of the first doped semiconductor layer 12 and configured to collect carriers is formed in the second region 14 (or on the second region 14), so that ranges of the first region 13 and the second region 14 on the back surface of the silicon substrate 11 may be determined according to requirements on a formation range of the first doped semiconductor layer 12, a length of the end portion arranged in a suspended manner in the first doped semiconductor layer 12, a formation range of the corresponding doped region (or the second doped semiconductor layer 17), and a current leakage-proof gap between the first doped semiconductor layer 12 and the corresponding doped region (or the second doped semiconductor layer 17) in an actual application scenario, which are not specifically limited herein.

During an actual manufacturing process, by forming the groove structure concaving inward into the silicon substrate relative to the surface of the first region on the second region on the back surface of the silicon substrate, the end portion of the first doped semiconductor layer adjacent to the second region may be arranged in a suspended manner. Based on this, a morphology of the groove structure formed on the second region may be determined according to an actual manufacturing process, provided that the end portion of the first doped semiconductor layer adjacent to the second region is arranged in a suspended manner through the groove structure.

For example, a depth of the groove structure may be greater than or equal to 200 nm and less than or equal to 2500 nm. For example, the depth of the groove structure may be 200 nm, 500 nm, 1000 nm, 1500 nm, 2000 nm, or 2500 nm. In this case, when the depth of the groove structure falls within the foregoing range, a weak reflection effect of the end portion to light caused by a small suspension height corresponding to the end portion of the first doped semiconductor layer adjacent to the second region due to a small depth can be prevented, which is conducive to enabling more light to go back into the silicon substrate under the reflection effect of the end portion of the first doped semiconductor layer adjacent to the second region, thereby ensuring high light utilization of the back contact solar cell. As shown in FIG. 1 and FIG. 2, a small staggering degree between the first doped semiconductor layer 12 and the corresponding doped region located in the second region 14 (or the second doped semiconductor layer 17 formed on the second region 14) that are both located on the back surface of the silicon substrate 11 and have opposite conductivity types along the thickness direction of the silicon substrate 11 due to a small groove may also be prevented, further reducing a current leakage risk on the back surface. In addition, a decrease in a suspension length of the end portion on the second region 14 caused by an impact of an etching solution etching the silicon substrate 11 on the end portion of the first doped semiconductor layer 12 due to a large depth of the groove structure 15 may also be prevented, thereby ensuring that more light may go back into the silicon substrate 11 under the reflection effect of the end portion that is of the first doped semiconductor layer 12 adjacent to the second region 14 and has a large length. Further, a requirement for usage of a silicon substrate 11 with a large thickness to manufacturing the back contact solar cell provided in the embodiments of this application due to a large depth of the groove structure 15 may also be prevented, thereby helping implement production of a thin back contact solar cell while reducing manufacturing costs of the back contact solar cell.

Figure 12:
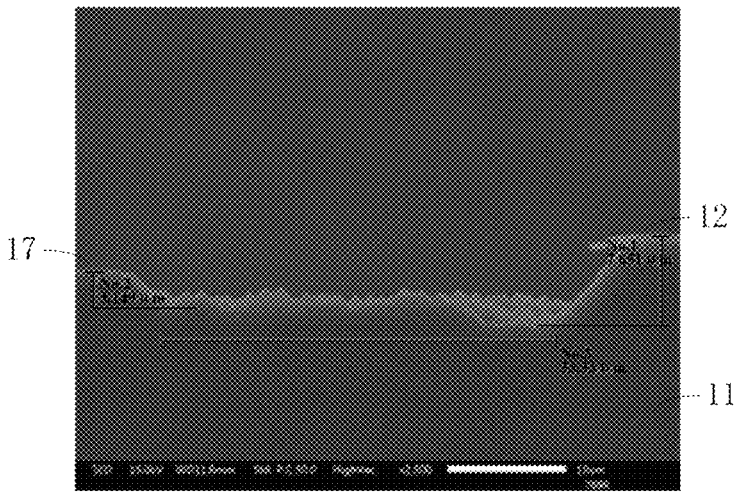
FIG. 12 is a first SEM image of a partial structure when a back contact solar cell further includes a second doped semiconductor layer according to an embodiment of this application.
Figure 13:
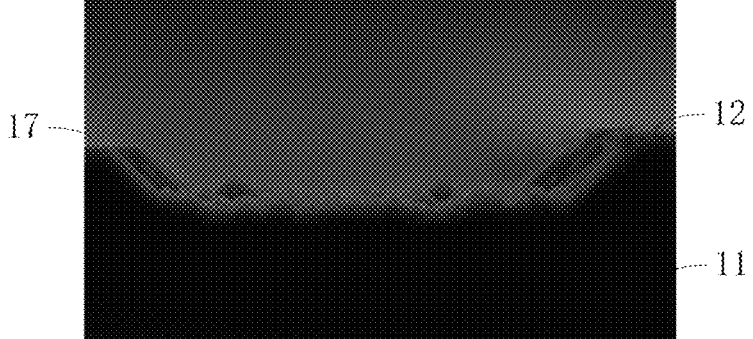
FIG. 13 is a second SEM image of a partial structure when a back contact solar cell further includes a second doped semiconductor layer according to an embodiment of this application.
Figure 14:
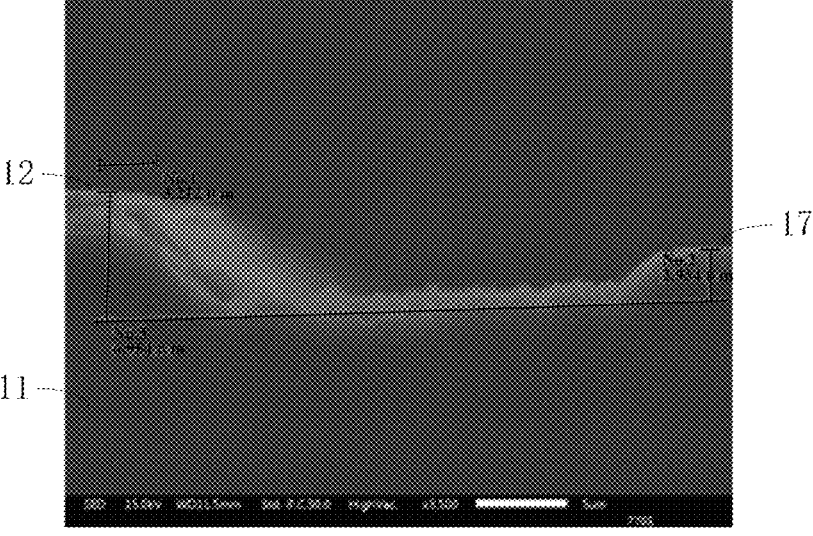
FIG. 14 is a third SEM image of a partial structure when a back contact solar cell further includes a second doped semiconductor layer according to an embodiment of this application.
Figure 15:
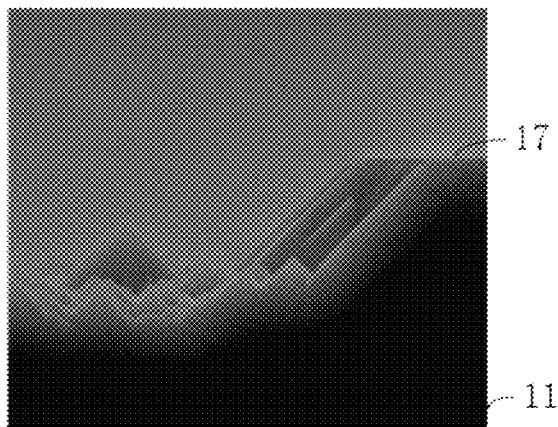
FIG. 15 is a first SEM image of a structure of a back contact solar cell at a side wall of a second doped semiconductor layer opposite to a first doped semiconductor layer according to an embodiment of this application.
Figure 16:
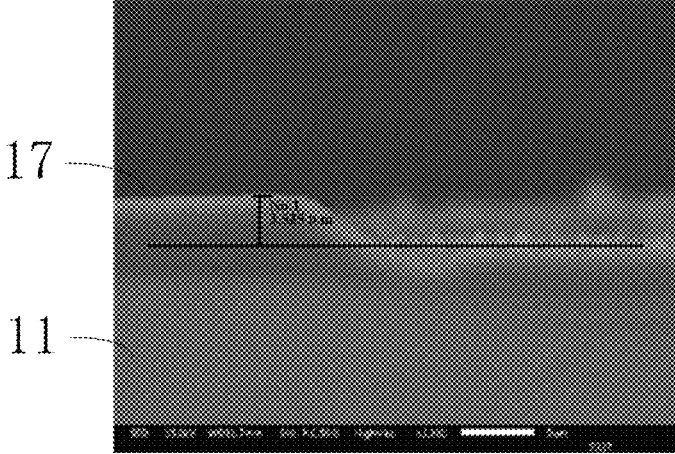
FIG. 16 is a second SEM image of a structure of a back contact solar cell at a side wall of a second doped semiconductor layer opposite to a first doped semiconductor layer according to an embodiment of this application.
Figure 17:
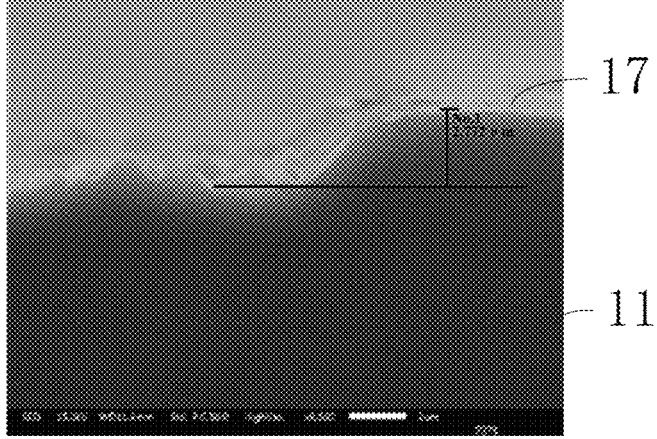
FIG. 17 is a third SEM image of a structure of a back contact solar cell at a side wall of a second doped semiconductor layer opposite to a first doped semiconductor layer according to an embodiment of this application.
Figure 18:
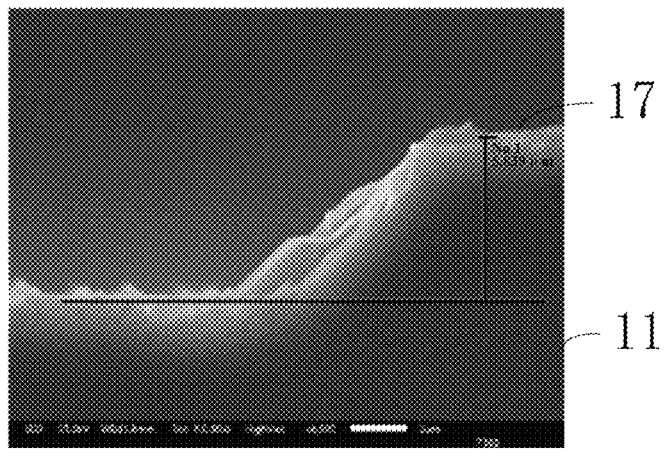
FIG. 18 is a fourth SEM image of a structure of a back contact solar cell at a side wall of a second doped semiconductor layer opposite to a first doped semiconductor layer according to an embodiment of this application.

In addition, as shown in FIG. 1 and FIG. 2, a groove bottom of the groove structure 15 may be a planar surface. Alternatively, as shown in FIG. 3, at least a partial surface of the groove bottom of the groove structure 15 may be a textured surface. Specifically, as shown in FIG. 3, the whole surface of the groove bottom of the groove structure 15 is a textured surface. In this case, the textured surface has an uneven surface feature, when the groove bottom of the groove structure 15 is a textured surface, a surface area of a corresponding doped region (or the second doped semiconductor layer) formed at the groove bottom of the groove structure 15 may be increased, so that a contact area between the corresponding doped region (or the second doped semiconductor layer) and an electrode (not shown in the figure) may be further increased, thereby reducing contact resistance and helping improve the photoelectric conversion efficiency of the back contact solar cell. Alternatively, as shown in FIG. 12 to FIG. 14, a partial surface of the groove structure 15 exposed outside a second passivation layer 18 and the second doped semiconductor layer 17 that are stacked (a stacked structure and the second passivation layer 18 are described in detail below and visible in FIG. 19) is a textured surface. In this way, the partial surface has a specific light trapping effect, so that more light is transmitted into the silicon substrate 11 through the groove bottom of the groove structure 15. Besides, the second passivation layer 18 is formed on a planar part of the groove bottom, so that a passivation effect of the second passivation layer 18 on the partial surface may be improved, to improve the photoelectric conversion efficiency of the back contact solar cell.

For a morphology of a side wall of the groove structure, surfaces of parts of the side wall of the groove structure may all be arranged perpendicular to a horizontal plane, and cross-sectional areas of the parts of the groove structure along a depth direction thereof are the same. Alternatively, as shown in FIG. 1 to FIG. 4, at least a partial surface in the side wall of the groove structure 15 is arranged obliquely relative to the horizontal plane, to cause a cross-sectional area of at least a partial region of the groove structure 15 to gradually increase along the direction from the light receiving surface to the back surface; In this case, an area of the groove bottom of the groove structure 15 is less than an area of a groove opening thereof, which is conducive to increasing a gap between the first doped semiconductor layer 12 and the corresponding doped region that has a conductivity type opposite to that of the first doped semiconductor layer 12 and located in the second region 14 (or the second doped semiconductor layer 17 formed on the second region 14) along the arrangement direction of the first region 13 and the second region 14, thereby reducing a current leakage risk on the back surface of the back contact solar cell and ensuring high electrical reliability of the back contact solar cell. In addition, the part arranged obliquely relative to the horizontal plane in the side wall of the groove structure 15 also helps reflect light, thereby further reducing a probability that the light is refracted out from the back surface of the back contact solar cell, which is further conducive to improving the photoelectric conversion efficiency of the back contact solar cell.

In the foregoing case, an included angle between the part arranged obliquely relative to the horizontal plane in the side wall of the groove structure and the horizontal plane may be determined according to an actual manufacturing process and a light reflection requirement on the side wall of the groove structure, which is not specifically limited herein.

For example, the angle between the part arranged obliquely relative to the horizontal plane in the side wall of the groove structure and the horizontal plane may be greater than or equal to 52° and less than or equal to 58°. For example, the angle between the part arranged obliquely relative to the horizontal plane in the side wall of the groove structure and the horizontal plane may be 52°, 53°, 54°, 55°, 56°, 57°, or 58°. In this case, when the angle between the part arranged obliquely relative to the horizontal plane in the side wall of the groove structure and the horizontal plane falls within the foregoing range, a weak effect of the part arranged obliquely relative to the horizontal plane in the side wall of the groove structure in reflecting light back into the silicon substrate caused by a large or small angle may be prevented, thereby ensuring that more light can go back into the silicon substrate and be reused by the silicon substrate under a strong reflection effect of the part arranged obliquely relative to the horizontal plane in the side wall of the groove structure, and further improving the light utilization of the back contact solar cell.

Figure 4:
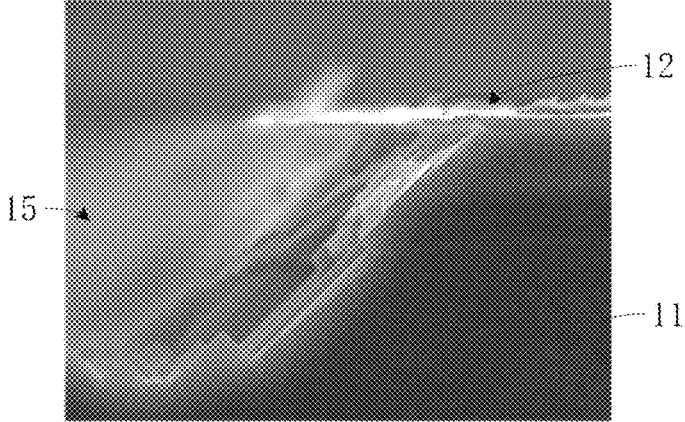
FIG. 4 is a first SEM image of a structure of a back contact solar cell at an end portion of a first doped semiconductor layer adjacent to a second region according to an embodiment of this application.
Figure 5:
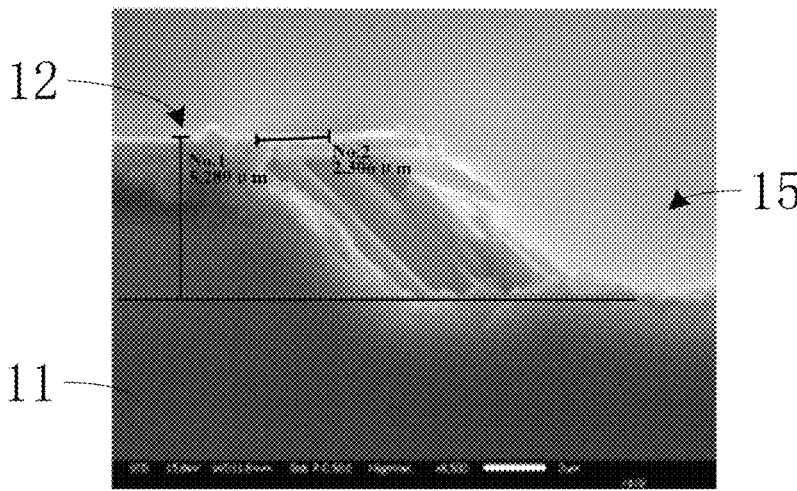
FIG. 5 is a second SEM image of a structure of a back contact solar cell at an end portion of a first doped semiconductor layer adjacent to a second region according to an embodiment of this application.
Figure 6:
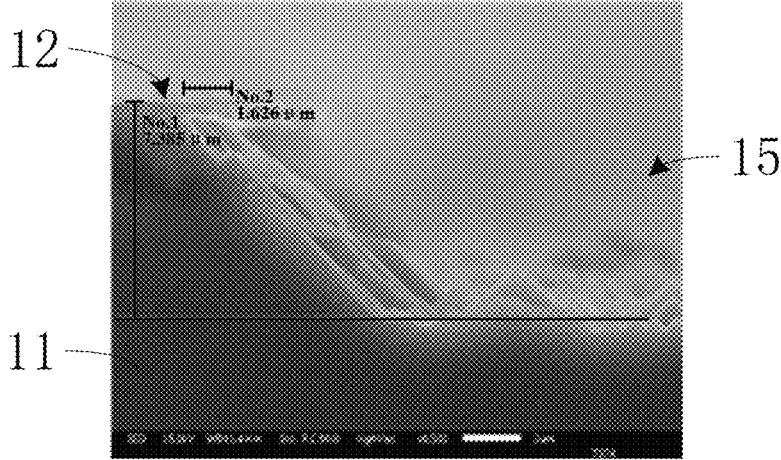
FIG. 6 is a third SEM image of a structure of a back contact solar cell at an end portion of a first doped semiconductor layer adjacent to a second region according to an embodiment of this application.

In addition, in the foregoing case, as shown in FIG. 4 to FIG. 6, all surfaces in the side wall of the groove structure 15 may all be arranged obliquely relative to the horizontal plane.

Figure 7:
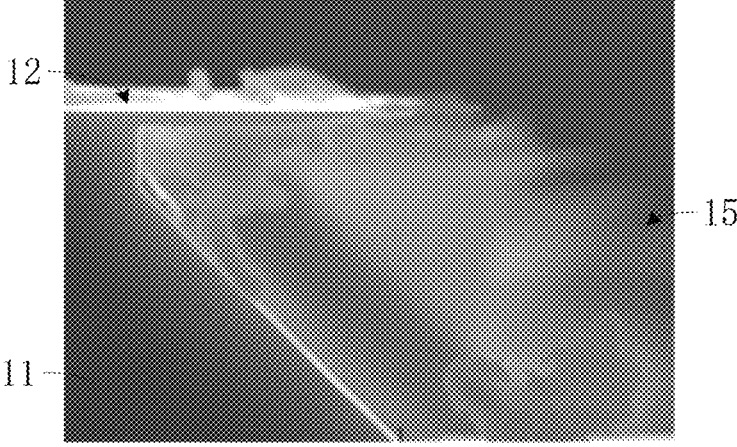
FIG. 7 is a fourth SEM image of a structure of a back contact solar cell at an end portion of a first doped semiconductor layer adjacent to a second region according to an embodiment of this application.
Figure 8:
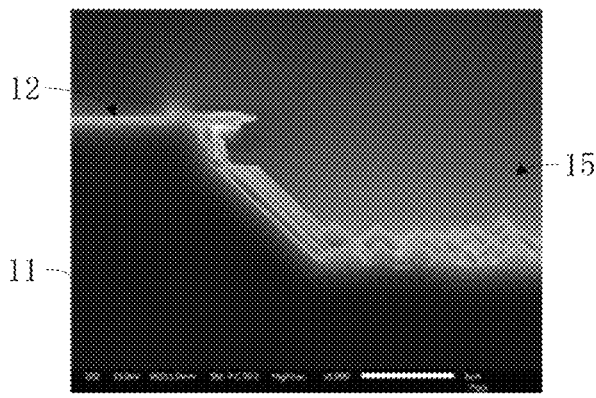
FIG. 8 is a fifth SEM image of a structure of a back contact solar cell at an end portion of a first doped semiconductor layer adjacent to a second region according to an embodiment of this application.
Figure 9:
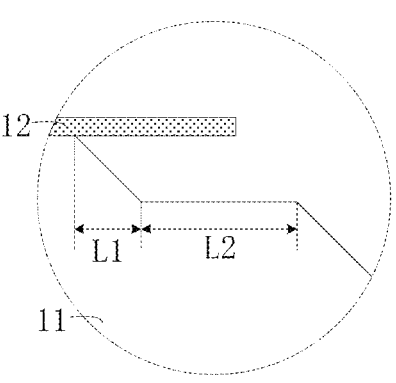
FIG. 9 is a schematic enlarged view of a structure of a back contact solar cell at an end portion of a first doped semiconductor layer adjacent to a second region according to an embodiment of this application.

Alternatively, as shown in FIG. 7 to FIG. 9, only a partial surface in the side wall of the groove structure 15 is arranged obliquely relative to the horizontal plane; and in the remaining surfaces, there may be at least a partial surface arranged perpendicular to the horizontal plane, and there may also be at least a partial surface arranged parallel to the horizontal plane. In this case, the morphology of the side wall of the groove structure 15 may be at least divided into the following three cases:

First: as shown in FIG. 7, in the side wall of the groove structure 15, a partial surface close to the groove opening is arranged perpendicular to the horizontal plane, and the remaining surfaces are all arranged obliquely relative to the horizontal plane.

Second: as shown in FIG. 8, in the side wall of the groove structure 15, a partial surface close to the groove opening is arranged perpendicular to the horizontal plane, a partial surface close to the groove bottom is arranged obliquely relative to the horizontal plane, and a planar surface arranged parallel to the horizontal plane exists between the partial surface close to the groove opening and the partial surface close to the groove bottom.

Third: as shown in FIG. 9, in the side wall of the groove structure 15, a partial surface close to the groove opening is arranged obliquely relative to the horizontal plane, a partial surface close to the groove bottom is arranged obliquely relative to the horizontal plane, and a planar surface arranged parallel to the horizontal plane exists between the partial surface close to the groove opening and the partial surface close to the groove bottom.

A height of a surface arranged perpendicular to the horizontal plane in the side wall of the groove structure, a length of a planar surface arranged parallel to the horizontal plane in the side wall of the groove structure along the arrangement direction of the first region and the second region, and a size of a gap between the planar surface arranged parallel to the horizontal plane in the side wall of the groove structure and the groove opening of the groove structure along the arrangement direction of the first region and the second region may be determined according to an actual manufacturing process, which are not specifically limited herein.

For example, as shown in FIG. 9, along the arrangement direction of the first region and the second region, a length L2 of the planar surface arranged parallel to the horizontal plane in the side wall of the groove structure may be greater than 0 and less than 2 μm. For example, the length L2 of the planar surface arranged parallel to the horizontal plane in the side wall of the groove structure may be 0.1 μm, 0.5 μm, 0.8 μm, 1 μm, 1.5 μm, or 2 μm. In this case, within a specific range, along the arrangement direction of the first region and the second region, the length of the planar surface arranged parallel to the horizontal plane in the side wall of the groove structure is in direct proportion to an etching time corresponding to the groove structure. Based on this, when the length of the planar surface arranged parallel to the horizontal plane in the side wall of the groove structure falls within the foregoing range, a long etching time corresponding to the groove structure caused by a large length may be prevented, thereby ensuring a specific length of the end portion that is of the first doped semiconductor layer 12 adjacent to the second region and arranged in a suspended manner after the groove structure is formed.

For example, as shown in FIG. 9, along the arrangement direction of the first region and the second region, a minimum distance L1 between the planar surface arranged parallel to the horizontal plane in the side wall of the groove structure and the groove opening of the groove structure may be greater than 0 and less than 1 μm. For example, the minimum distance L1 between the planar surface arranged parallel to the horizontal plane in the side wall of the groove structure and the groove opening of the groove structure may be 0.1 μm, 0.3 μm, 0.6 μm, 0.9 μm, or 1 μm. In this case, a poor reflection cooperation effect between the planar surface and the end portion arranged in a suspended manner in the first doped semiconductor layer 12 caused by a large gap between the planar surface arranged parallel to the horizontal plane in the side wall of the groove structure and the groove opening of the groove structure along the arrangement direction of the first region and the second region may be prevented, thereby ensuring that more light can be reflected back into the silicon substrate 11 under a joint effect of the planar surface and the end portion arranged in a suspended manner, and further improving the light utilization of the back contact solar cell.

It should be noted that, as shown in FIG. 4 to FIG. 9, in the back contact solar cell provided in the embodiments of this application, the groove structure 15 located on the second region 14 includes a plurality of possible morphologies, which is conducive to improving the applicability of the back contact solar cell provided in the embodiments of this application in different application scenarios. In addition, in the side wall of the groove structure 15, when a planar surface arranged parallel to the horizontal plane exists between the partial surface close to the groove opening and the partial surface close to the groove bottom, the side wall of the groove structure 15 includes two surfaces at least having different arrangement angles relative to the horizontal plane, which is conducive to reflection of different parts in the side wall of the groove structure 15 to light at different angles, and is further conducive to enabling more light to go back into the silicon substrate 11 and be reused by the silicon substrate 11 under a reflection effect of the side wall of the groove structure 15.

For the first doped semiconductor layer, in terms of a material, a material of the first doped semiconductor layer may be a semiconductor material such as silicon, silicon germanium, germanium, or gallium arsenide. In terms of arrangement of substances, a crystalline phase of the first doped semiconductor layer may be an amorphous semiconductor layer, a microcrystalline semiconductor layer, a nanocrystalline semiconductor layer, a monocrystalline semiconductor layer, or a polycrystalline semiconductor layer.

A thickness of the first doped semiconductor layer may be set according to an actual requirement, which is not specifically limited herein. For example, the thickness of the first doped semiconductor layer may be greater than or equal to 100 nm and less than or equal to 500 nm.

In addition, it can be learned from the content described above that, the end portion that is of the first doped semiconductor layer adjacent to the second region and arranged in a suspended manner has a reflection effect for light, so that the part of light refracted out from the back surface of the silicon substrate is reflected back into the silicon substrate and reused by the silicon substrate under an action of the end portion. In addition, it may be understood that, a longer end portion arranged in a suspended manner in the first doped semiconductor layer indicates a larger coverage length of the end portion on the second region. Two doped regions with opposite conductivity types are arranged on the back surface of the back contact solar cell, so that a larger length of the end portion that is of the first doped semiconductor layer adjacent to the second region and arranged in a suspended manner indicates a higher current leakage risk. Based on this, the length of the end portion arranged in a suspended manner in the first doped semiconductor layer may be determined according to requirements on the light utilization and current leakage of the back contact solar cell in an actual application scenario.

For example, along the arrangement direction of the first region and the second region, the length of the end portion arranged in a suspended manner in the first doped semiconductor layer may be greater than 0 and less than or equal to 3000 nm. For example, the length of the end portion arranged in a suspended manner in the first doped semiconductor layer may be 1 nm, 50 nm, 100 nm, 500 nm, 1000 nm, 1500 nm, 2000 nm, 2500 nm, or 3000 nm. In this case, when the length of the end portion arranged in a suspended manner in the first doped semiconductor layer falls within the foregoing range, current leakage easily caused by a small gap between the first doped semiconductor layer and the corresponding doped region located in the second region (or the second doped semiconductor layer formed on the second region) due to a large length of the end portion arranged in a suspended manner in the first doped semiconductor layer may be prevented, thereby ensuring high electrical reliability of the back contact solar cell. In addition, when the length of the end portion arranged in a suspended manner in the first doped semiconductor layer is greater than 0 and less than or equal to 3000 nm, the length of the end portion arranged in a suspended manner has a large optional range, which is conducive to reducing the difficulty in manufacturing a first doped semiconductor layer with a fixed length, and may also improve the applicability of the back contact solar cell provided in the embodiments of this application in different application scenarios.

Figure 10:
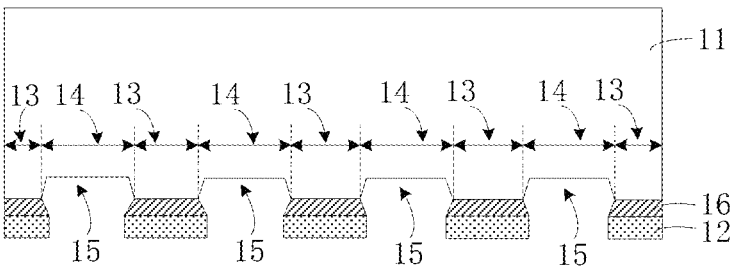
FIG. 10 is a schematic longitudinal cross-sectional view of a fourth structure of a back contact solar cell according to an embodiment of this application.

In an actual application process, as shown in FIG. 1 to FIG. 3, a part of the first doped semiconductor layer 12 may be directly formed on the first region 13 of the silicon substrate 11. Alternatively, as shown in FIG. 10, the back contact solar cell further includes a first passivation layer 16 located between the first region 13 and the first doped semiconductor layer 12. In this case, the first passivation layer 16 and the first doped semiconductor layer 12 may form a selective contact structure to perform chemical passivation on a corresponding region on the back surface of the silicon substrate 11 and selectively collect carriers of a corresponding conductivity type, thereby reducing the carrier recombination rate on the back surface and helping improve the photoelectric conversion efficiency of the back contact solar cell.

Specifically, a material of the first passivation layer may be determined according to the material of the first doped semiconductor layer and a type of the selective contact structure formed by the first passivation layer and the first doped semiconductor layer in an actual application scenario, which is not specifically limited herein.

For example, when the selective contact structure formed by the first passivation layer and the first doped semiconductor layer is a tunneling passivation contact structure, the first doped semiconductor layer is a doped polysilicon layer, and the first passivation layer is a tunneling passivation layer. A material of the tunneling passivation layer may include silicon oxide, aluminum oxide, titanium oxide, or other materials, and may also be referred to as a tunneling oxide layer.

For another example, when the selective contact structure formed by the first passivation layer and the first doped semiconductor layer is a heterogeneous contact structure, the first doped semiconductor layer is a doped amorphous silicon layer and/or a doped microcrystalline silicon layer, and the first passivation layer is an intrinsic amorphous silicon layer and/or an intrinsic microcrystalline silicon layer.

A thickness of the first passivation layer may be set according to an actual requirement, which is not specifically limited herein. For example, the thickness of the first passivation layer may be greater than or equal to 0.5 nm and less than or equal to 3 nm.

For the conductivity type of the first doped semiconductor layer, as described above, the conductivity type of the first doped semiconductor layer may be opposite to the conductivity type of the silicon substrate. Alternatively, the conductivity type of the first doped semiconductor layer may be the same as the conductivity type of the silicon substrate. In this case, the back contact solar cell provided in the embodiments of this application further includes a second doped semiconductor layer formed on the groove bottom of the groove structure, where a conductivity type of the second doped semiconductor layer is opposite to the conductivity type of the silicon substrate.

Figure 11:
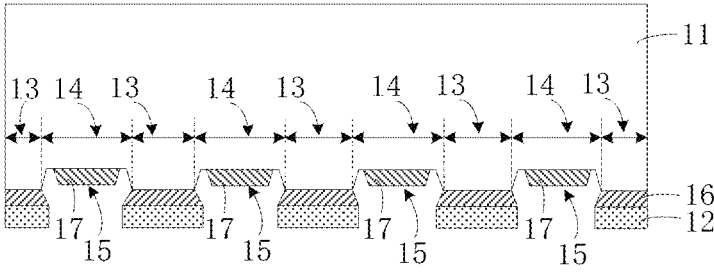
FIG. 11 is a schematic longitudinal cross-sectional view of a fifth structure of a back contact solar cell according to an embodiment of this application.

It should be noted that, as shown in FIG. 2 and FIG. 11, no matter whether the conductivity type of the first doped semiconductor layer 12 is opposite to or the same as the conductivity type of the silicon substrate 11, the back contact solar cell provided in the embodiments of this application may include the second doped semiconductor layer 17 formed on the groove bottom of the groove structure 15. In addition, the conductivity type of the second doped semiconductor layer 17 is opposite to the conductivity type of the first doped semiconductor layer 12. The second doped semiconductor layer 17 is only formed on the groove bottom of the groove structure 15, and the side wall of the groove structure 15 is exposed outside the second doped semiconductor layer 17. In addition, the first doped semiconductor layer 12 and the second doped semiconductor layer 17 are spaced apart and are not in contact with each other, to avoid current leakage.

Specifically, a material of the second doped semiconductor layer may include a semiconductor material such as silicon, silicon germanium, germanium, or gallium arsenide. A crystalline phase of the second doped semiconductor layer may be an amorphous semiconductor layer, a nanocrystalline semiconductor layer, a microcrystalline semiconductor layer, a monocrystalline semiconductor layer, or a polycrystalline semiconductor layer. In addition, a thickness of the second doped semiconductor layer is not specifically limited in the embodiments of this application, provided that the second doped semiconductor layer can be applied to the back contact solar cell provided in the embodiments of this application.

A gap between the first doped semiconductor layer and the second doped semiconductor layer along the arrangement direction of the first region and the second region may be determined according to a current leakage-proof requirement on the back contact solar cell in an actual application scenario, which is not specifically limited herein.

For example, along the arrangement direction of the first region and the second region, the gap between the first doped semiconductor layer and the second doped semiconductor layer may be greater than or equal to 20 μm and less than or equal to 110 μm. For example, the gap between the first doped semiconductor layer and the second doped semiconductor layer may be 20 μm, 40 μm, 60 μm, 80 μm, 100 μm, or 110 μm. In this case, when the gap between the first doped semiconductor layer and the second doped semiconductor layer that have opposite conductivity types falls within the foregoing range, current leakage between the first doped semiconductor layer and the second doped semiconductor layer caused by a small gap can be prevented, thereby ensuring high electrical reliability of the back contact solar cell. In addition, it can also be prevented that carriers on the back surface cannot be collected by the first doped semiconductor layer and/or the second doped semiconductor layer in time and led out by corresponding electrodes due to a large gap, thereby further reducing the carrier recombination rate on the back surface.

In addition, a side wall of the second doped semiconductor layer opposite to the first doped semiconductor layer may be arranged perpendicular to the horizontal plane. Alternatively, as shown in FIG. 12 to FIG. 18, the side wall of the second doped semiconductor layer 17 opposite to the first doped semiconductor layer 12 may be arranged obliquely relative to the horizontal plane. In this case, a risk of transverse current leakage between the first doped semiconductor layer 12 and the second doped semiconductor layer 17 may be reduced, thereby ensuring high electrical reliability of the back contact solar cell. A magnitude of an angle by which the side wall of the second doped semiconductor layer 17 opposite to the first doped semiconductor layer 12 is arranged obliquely relative to the horizontal plane may be determined according to an actual application scenario, which is not specifically limited herein.

Figure 19:
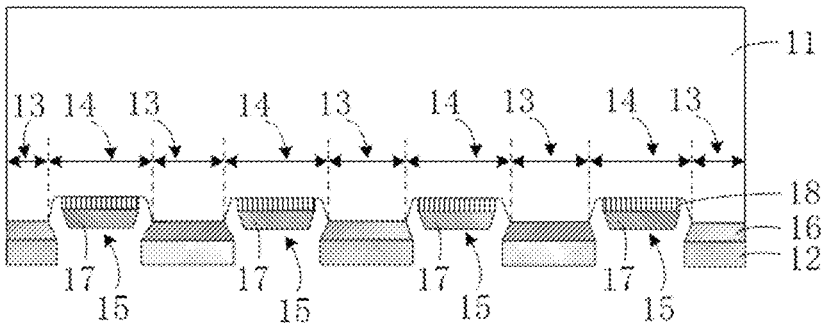
FIG. 19 is a schematic longitudinal cross-sectional view of a sixth structure of a back contact solar cell according to an embodiment of this application.

In some cases, as shown in FIG. 19, the back contact solar cell provided in the embodiments of this application may further include a second passivation layer 18 located between the silicon substrate 11 and the second doped semiconductor layer 17. In this case, the second passivation layer 18 and the second doped semiconductor layer 17 may form a selective contact structure to perform chemical passivation on a corresponding region on the back surface of the silicon substrate 11 and selectively collect carriers of a corresponding conductivity type, thereby reducing the carrier recombination rate on the back surface and helping improve the photoelectric conversion efficiency of the back contact solar cell.

Specifically, a material of the second passivation layer may be determined according to the material of the second doped semiconductor layer and a type of the selective contact structure formed by the second passivation layer and the second doped semiconductor layer in an actual application scenario, which is not specifically limited herein.

For example, when the selective contact structure formed by the second passivation layer and the second doped semiconductor layer is a tunneling passivation contact structure, the second doped semiconductor layer is a doped polysilicon layer, and the second passivation layer is a tunneling passivation layer. A material of the tunneling passivation layer may include silicon oxide, aluminum oxide, titanium oxide, or other materials.

For another example, when the selective contact structure formed by the second passivation layer and the second doped semiconductor layer is a heterogeneous contact structure, the second doped semiconductor layer is a doped amorphous silicon layer and/or a doped microcrystalline silicon layer, and the second passivation layer is an intrinsic amorphous silicon layer and/or an intrinsic microcrystalline silicon layer.

According to a second aspect, an embodiment of this application provides a method for manufacturing a back contact solar cell. The following describes a manufacturing process with reference to cross-sectional views of operations shown in FIG. 20 to FIG. 24. Specifically, the method for manufacturing a back contact solar cell includes the following steps:

First, a silicon substrate is provided. For a specific structure of the silicon substrate, reference may be made to the foregoing description, and details are not described herein.

Figures 21, 22, 23, 24:
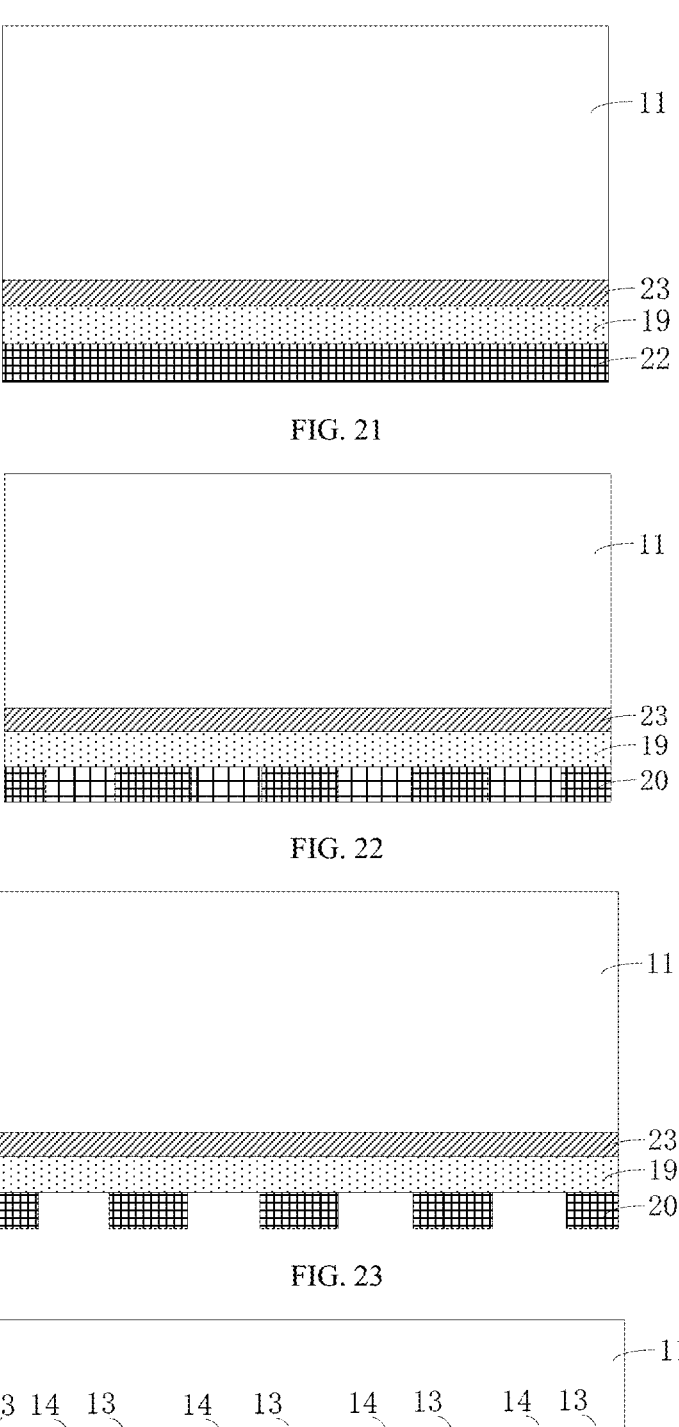
FIG. 21 is a second schematic structural diagram of a back contact solar cell in a manufacturing process according to an embodiment of this application.
FIG. 22 is a third schematic structural diagram of a back contact solar cell in a manufacturing process according to an embodiment of this application.
FIG. 23 is a fourth schematic structural diagram of a back contact solar cell in a manufacturing process according to an embodiment of this application.
FIG. 24 is a fifth schematic structural diagram of a back contact solar cell in a manufacturing process according to an embodiment of this application.

Next, as shown in FIG. 23, a doped semiconductor material layer 19 entirely arranged is formed on a back surface of the silicon substrate 11 and a mask layer 20 located on a part of the doped semiconductor material layer 19 is formed.

In an actual manufacturing process, the doped semiconductor material layer is used for manufacturing the first doped semiconductor layer of the back contact solar cell described above, so that a material and a thickness of the doped semiconductor material layer may be determined according to the material and the thickness of the first doped semiconductor layer described above. In addition, a formation process of the doped semiconductor material layer and a specific formation procedure of the mask layer may be determined according to a specific material of the doped semiconductor material layer.

Figure 20:
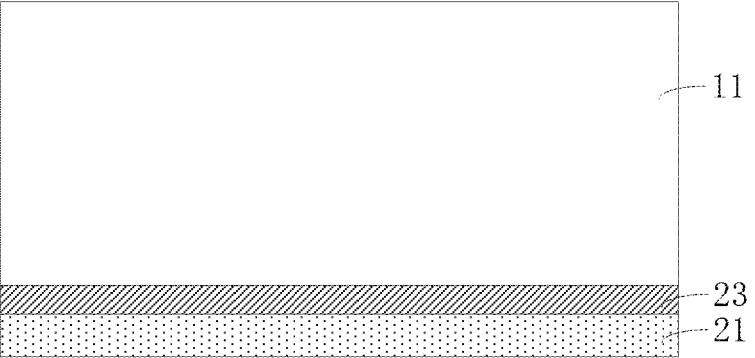
FIG. 20 is a first schematic structural diagram of a back contact solar cell in a manufacturing process according to an embodiment of this application.

For example, in a case that the material of the first doped semiconductor layer includes silicon, the step of forming a doped semiconductor material layer on the silicon substrate and a mask layer on a part of the doped semiconductor material layer may include the following steps: as shown in FIG. 20, forming an intrinsic semiconductor material layer 21 entirely arranged on the back surface of the silicon substrate 11; as shown in FIG. 21, performing doping treatment on the intrinsic semiconductor material layer, to form the intrinsic semiconductor material layer into the doped semiconductor material layer 19, and forming a doped silicate glass layer 22 entirely arranged on the doped semiconductor material layer 19; as shown in FIG. 22, performing heat treatment on a part of the doped silicate glass layer by using a laser etching process, to form a part of the doped silicate glass layer on which the heat treatment is not performed into the mask layer 20; and as shown in FIG. 23, removing the part of the doped silicate glass layer on which the heat treatment is performed.

Specifically, that the material of the first doped semiconductor layer includes silicon may refer to that the material of the first doped semiconductor layer includes only silicon; or the material of the first doped semiconductor layer includes silicon and other semiconductor materials such as silicon germanium. Secondly, in an actual manufacturing process, the intrinsic semiconductor material layer entirely arranged on the back surface may be formed by using a chemical vapor deposition process. Next, doping treatment may be performed on the intrinsic semiconductor material layer by using a diffusion process. After the foregoing doping treatment, not only the doped semiconductor material layer can be obtained, but also the doped silicate glass layer entirely arranged may be formed on the doped semiconductor material layer. Heat treatment is then performed on a part of the doped silicate glass layer by using the laser etching process. In this case, as shown in FIG. 22, the part of the doped silicate glass layer on which laser treatment is performed has poor density and is easy to remove. A part of the doped silicate glass layer on which the laser treatment is not performed has high density and is not easy to remove. Therefore, after the heat treatment, different parts of the doped silicate glass layer have different etching selection ratios, and when the mask layer 20 for patterning the doped semiconductor material layer 19 is obtained, there is no need to additionally form other mask materials and other mask deposition processes to obtain the mask layer 20, thereby helping reduce the manufacturing costs of the back contact solar cell and simplifying a manufacturing procedure of the back contact solar cell. A specific condition of the laser etching process may be set according to an actual application scenario, which is not specifically limited herein.

For example, a laser used in the laser etching process may be a nanosecond laser, a picosecond laser, or a femtosecond laser. A processing power used by the laser etching process may be greater than or equal to 10 W and less than or equal to 100 W, and a diameter of a laser spot may be greater than or equal to 50 μm and less than or equal to 300 μm.

Certainly, in a case that the material of the first doped semiconductor layer includes silicon or the material of the first doped semiconductor layer does not include silicon, the doped semiconductor material layer entirely arranged on the back surface may alternatively be formed by using processes such as chemical vapor deposition and doping. Then, the mask layer whose material is silicon nitride or another material having a masking effect may be formed by using processes such as chemical vapor deposition and etching.

It should be noted that, when the manufactured back contact solar cell further includes a first passivation layer located between the first region and the first doped semiconductor layer, after the step of providing a silicon substrate and before the step of forming a doped semiconductor material layer entirely arranged on a back surface of the silicon substrate and a mask layer located on a part of the doped semiconductor material layer, the method for manufacturing a back contact solar cell further includes a step: as shown in FIG. 20, forming a first passivation material layer 23 entirely arranged on the back surface of the silicon substrate 11.

Specifically, the first passivation material layer may be formed by using processes such as chemical vapor deposition. The first passivation material layer is used for manufacturing the first passivation layer, so that a material and a thickness of the first passivation material layer may be determined according to a material and a thickness of the first passivation layer.

Next, as shown in FIG. 24, the doped semiconductor material layer is selectively etched using the mask layer 20, to forming a remaining part of the doped semiconductor material layer into the first doped semiconductor layer 12, where a region corresponding to the first doped semiconductor layer 12 in the back surface of the silicon substrate 11 is defined as a first region 13, and a remaining region is defined as a second region 14. The first region 13 and the second region 14 are alternately distributed. Next, a groove structure 15 concaving inward into the silicon substrate 11 relative to a surface of the first region 13 is formed using the mask layer 20 on the second region 14, to cause an end portion of the first doped semiconductor layer 12 adjacent to the second region 14 to be arranged in a suspended manner.

In an actual manufacturing process, the groove structure concaving inward into the silicon substrate relative to the surface of the first region may be formed on the second region by using processes such as a wet chemical process and using the mask layer, to prevent a high-temperature laser from causing damage to the silicon substrate, which is conducive to improving a yield of the back contact solar cell. In addition, when the groove structure is formed by using the wet chemical process, an etching process of a wet chemical solution to the silicon substrate is approximately isotropic etching, which is conducive to increasing a length of the end portion arranged in a suspended manner in the first doped semiconductor layer.

Specifically, a process condition of performing selectively etching on the doped semiconductor material layer may be determined according to an etching process used, the material of the doped semiconductor material layer, and a specification of the formed groove structure, which is not specifically limited herein.

For example, when the groove structure concaving inward into the silicon substrate relative to the surface of the first region is formed on the second region by using the wet chemical process and using the mask layer, a process temperature of the wet chemical process may be greater than or equal to 65° C. and less than or equal to 85° C. In addition, a process time of the wet chemical process may be greater than 50 s and less than or equal to 500 s. For example, the process temperature of the wet chemical process may be 65° C., 70° C., 75° C., 80° C., or 85° C. The process time of the wet chemical process may be 50 s, 100 s, 200 s, 300 s, 400 s, or 500 s. In this case, both the process temperature and the process time of the wet chemical process affect a specification of the groove structure formed through the wet chemical process and a specification of the end portion arranged in a suspended manner in the first doped semiconductor layer. Based on this, when the process temperature of the wet chemical process falls within the foregoing range, a small depth of the groove structure and a small suspension height and a small length of the end portion arranged in a suspended manner in the first doped semiconductor layer caused by a low process temperature may be prevented. In addition, a large depth of the groove structure caused by a high process temperature may also be prevented. For beneficial effects of preventing a small depth of the groove structure and a small suspension height and a small length of the end portion arranged in a suspended manner in the first doped semiconductor layer and preventing a large depth of the groove structure, reference may be made to the foregoing description. In addition, beneficial effects of the process time falling with the foregoing range are similar to the beneficial effects that the process temperature is greater than or equal to 65° C. and less than or equal to 85° C., and details are not described herein.

It should be noted that, if the first passivation material layer is formed on the back surface before the doped semiconductor layer is formed, after the step of selectively etching the doped semiconductor material layer using the mask layer and before the step of forming, using the mask layer, a groove structure concaving inward into the silicon substrate relative to a surface of the first region on the second region, the method for manufacturing a back contact solar cell further includes a step: selectively etching the first passivation material layer by using a wet chemical process and using the mask layer, to form a remaining part of the first passivation material layer into a first passivation layer.

In addition, in a case that a groove bottom of the groove structure in the manufactured back contact solar cell is a textured surface, while the step of forming, using the mask layer, a groove structure concaving inward into the silicon substrate relative to a surface of the first region on the second region is performed, texturing treatment is performed on the groove bottom of the groove structure, to form the groove bottom of the groove structure into a textured surface.

Specifically, a texturing assistant additive may be added to the wet chemical solution for etching a part of the silicon substrate to form the groove structure whose groove bottom is a textured surface. Specifically, a type of the texturing assistant additive and a proportion of the texturing assistant additive in the wet chemical solution may be determined according to an actual application scenario.

For example, the texturing assistant additive may include sodium benzoate, a defoaming agent, a surfactant, and the like. A proportion of the texturing assistant additive in the wet chemical solution may be greater than or equal to 0.5% and less than or equal to 5%.

In some cases, if the manufactured back contact solar cell further includes the second doped semiconductor layer, after the step of forming, using the mask layer, a groove structure concaving inward into the silicon substrate relative to a surface of the first region on the second region, the method for manufacturing a back contact solar cell further includes a step: forming a second doped semiconductor layer at a groove bottom of the groove structure. Specifically, the second doped semiconductor layer may be formed by using processes such as chemical vapor deposition and selectively etching. For a material and a thickness of the second doped semiconductor layer, reference may be made to the foregoing description, and details are not described herein.

In some cases, if the manufactured back contact solar cell further includes a second passivation layer located between the silicon substrate and the second doped semiconductor layer, after the step of forming, using the mask layer, a groove structure concaving inward into the silicon substrate relative to a surface of the first region on the second region and before the step of forming a second doped semiconductor layer at a groove bottom of the groove structure, the method for manufacturing a back contact solar cell further includes a step: forming a second passivation layer at the groove bottom of the groove structure. For a material and a thickness of the second passivation layer, reference may be made to the foregoing description.

Specifically, the second passivation layer may be formed at the groove bottom of the groove structure by using processes such as chemical vapor deposition and selective etching after the groove structure is formed and before the second doped semiconductor layer is formed.

Alternatively, a second passivation material layer and a second doped semiconductor material layer that are entirely arranged on the back surface may be formed sequentially by using processes such as chemical vapor deposition. A part of the second passivation material layer and a part of the second doped semiconductor material layer are then selectively removed by using processes such as laser etching, to obtain the second passivation layer and the second doped semiconductor layer that are only located at the groove bottom of the groove structure.

It should be noted that, in a case that the manufactured back contact solar cell further includes the second passivation layer and the second doped semiconductor layer, the groove bottom of the groove structure formed on the second region using the mask layer may be a planar surface. In this case, when the second passivation layer is formed at the groove bottom of the groove structure in the foregoing manner, the second passivation layer may be formed on a flat surface, which is conducive to improving a passivation effect of the second passivation layer to a corresponding partial surface of the silicon substrate. In addition, after the step of forming a second doped semiconductor layer at a groove bottom of the groove structure, texturing treatment may be performed on a part of the groove bottom of the groove structure exposed outside the second doped semiconductor layer, so that a surface of the groove bottom of the groove structure exposed outside the second doped semiconductor layer has a specific light trapping effect, and more light can be transmitted into the silicon substrate through the surface of the groove bottom of the groove structure exposed outside the second doped semiconductor layer, thereby improving the photoelectric conversion efficiency of the back contact solar cell.

Specifically, in an actual manufacturing process, if patterning is performed on the second doped semiconductor material layer for manufacturing the second doped semiconductor layer by using a wet chemical process, the second doped semiconductor layer may be manufactured and the textured surface may be formed simultaneously in a manner of adding a texturing additive to an etching solution used by the wet chemical process. For specific components and a specific proportion of the texturing additive, reference may be made to the foregoing description, and details are not described herein. In this case, a large gap exists between a surface of the second doped semiconductor layer and a bottom region other than the second doped semiconductor layer 17 in the bottom of the groove structure. As shown in FIG. 12 to FIG. 18, after texturing treatment is performed on the part of the groove bottom of the groove structure exposed outside the second doped semiconductor layer, a depth of the region other than the second doped semiconductor layer in the groove structure is further deepened, so that a gap between the surface of the second doped semiconductor layer 17 and the bottom region other than the second doped semiconductor layer 17 in the bottom of the groove structure 15 is increased, for example, ranges from 2.7 micrometers to 5.8 micrometers, and the surface of the second doped semiconductor layer 17 does not extend to be suspended at a side wall in the groove structure 15 close to the second doped semiconductor layer 17. As shown in FIG. 12 to FIG. 18, this manner is conducive to isolation between the first doped semiconductor layer and the second doped semiconductor layer, especially when the first doped semiconductor layer extends to be suspended on the groove structure, and unnecessary accidental connection of the first doped semiconductor layer and the second doped semiconductor layer can be effectively controlled by controlling the surface of the second doped semiconductor layer not to extend to be suspended at the side wall in the groove structure 15 close to the second doped semiconductor layer 17.

For beneficial effects of the second aspect and various implementations of the second aspect in the embodiments of this application, reference may be made to the analysis of the beneficial effects of the first aspect and various implementations of the first aspect, and details are not described herein.

In addition, an embodiment of this application further provides a comparative example and an example to describe a manufacturing process and operating performance of the back contact solar cell provided in the embodiments of this application. Table 1 shows test results of back contact solar cells corresponding to Example 1 and Comparative Example 1.

Example 1

Step 1: Alkaline polishing was performed on a monocrystalline silicon wafer by using a 15% alkaline solution, to form a smooth and clean silicon surface.

Step 2: A tunneling oxide layer and an intrinsic polysilicon layer were deposited on the surface of the monocrystalline silicon wafer. A thickness of the tunneling oxide layer is 1.8 nm, and a thickness of the intrinsic polysilicon layer is 350 nm.

Step 3: Boron doping treatment was performed on the deposited intrinsic polysilicon layer to form the intrinsic polysilicon layer into a doped polysilicon layer; and a borosilicate glass layer was formed on the doped polysilicon layer. A doping concentration of boron is $8\times10^{19}$/cm3.

Step 4: Heat treatment was performed on the borosilicate glass layer by using a laser etching process to prepare a mask layer with a specific pattern. A laser may be a picosecond laser, a processing power of the laser may be 40 W, and a diameter of a spot of the laser is 200 μm.

Step 5: A part of the doped polysilicon layer was selectively removed using the mask layer; and surface etching treatment was performed on the monocrystalline silicon wafer, to form a groove structure and cause an end portion of the doped polysilicon layer adjacent to the groove structure to be arranged in a suspended manner. A main component of a used etching solution includes alkali and a texturing assistant additive. A concentration of the alkali in the etching solution is 5%, an etching temperature is 82° C., a process time is 300s, a proportion of the texturing assistant additive is 2%, and main components of the texturing assistant additive include sodium benzoate, a defoaming agent, and a surfactant.

Step 6: A tunneling oxide layer and an N-type doped polysilicon layer that are stacked in sequence were formed at a groove bottom of the groove structure. A thickness of the N-type doped polysilicon layer is greater than or equal to 150 nm and less than or equal to 180 nm. A thickness of the tunneling oxide layer is greater than or equal to 0.5 nm and less than or equal to 3 nm.

Comparative Example 1

In addition to Step 4 and Step 5, other steps of the manufacturing method corresponding to Comparative Example 1 are the same as the manufacturing procedure in Example 1. In the manufacturing method provided in Comparative Example 1, after boron doping treatment was performed on the deposited intrinsic polysilicon layer and the tunneling oxide layer and the N-type doped polysilicon layer that are stacked in sequence were formed at the groove bottom of the groove structure, the borosilicate glass layer was removed, selectively etching was directly performed on a tunneling oxide layer and a doped polysilicon layer that have been formed by using a laser etching process, and a groove structure with a side wall arranged perpendicular to a horizontal plane was formed in a silicon substrate.

TABLE 1

| Test results of back contact solar cells corresponding to Example 1 and Comparative Example 1 | | | | |
| --- | --- | --- | --- | --- |
| Project | Effi- ciency (%) | Open-circuit voltage (mV) | Short-circuit current (A) | Fill factor (%) |
| Comparative Example 1 | 25.158 | 735.6 | 14.062 | 81.00 |
| Experimental group | 25.233 | 736.2 | 14.072 | 81.12 |

It can be seen from data shown in Table 1 that, in the back contact solar cell formed by using the manufacturing method provided in Example 1, the end portion of the first doped semiconductor layer adjacent to the groove structure is arranged in a suspended manner, so that more light can be reflected back into the silicon substrate and reused by the silicon substrate, so that the operating efficiency, the open-circuit voltage, the short-circuit current, and the fill factor of the back contact solar cell are higher than those of the back contact solar cell obtained through the manufacturing method corresponding to Comparative Example 1. That is, the back contact solar cell provided in the embodiments of this application has higher operating performance.

In the foregoing description, technical details such as composition and etching of each layer are not described in detail. However, a person skilled in the art should understand that a layer, a region, and the like of a required shape may be formed through various technical means. In addition, to form the same structure, a person skilled in the art may further design a method that is not exactly the same as the method described above. In addition, although the embodiments are separately described above, this does not mean that the measures in the embodiments cannot be advantageously used in combination.

Embodiments of the present disclosure are described above. However, the embodiments are merely for illustrative purposes and are not intended to limit the scope of the present disclosure. The scope of the present disclosure is defined by the appended claims and equivalents thereof. A person skilled in the art may make various substitutes and modifications without departing from the scope of the present disclosure, and the substitutes and modifications shall fall within the scope of the present disclosure.

What is claimed is:

1. A back contact solar cell, comprising:
   a silicon substrate having a back surface comprising first regions and second regions that are alternately distributed;
   a first doped semiconductor layer formed on a first region on the back surface; and
   a groove structure formed on a second region, wherein the groove structure concaves inward into the silicon substrate relative to a surface of the first region, wherein an end portion of the first doped semiconductor layer adjacent to the second region is arranged in a suspended manner, wherein at least a partial surface in a side wall of the groove structure is arranged obliquely relative to a horizontal plane, to cause a cross-sectional area of at least a partial region of the groove structure to increase along a direction from a light receiving surface of the silicon substrate to the back surface, wherein the side wall of the groove structure comprises a planar surface arranged in parallel to the horizontal plane, and wherein the planar surface is between a partial surface close to a groove opening and a partial surface close to a groove bottom, and wherein the groove bottom comprises a textured surface.

2. The back contact solar cell according to claim 1, wherein a depth of the groove structure is greater than or equal to 200 nm and less than or equal to 2500 nm, and wherein along a direction that the first regions and the second regions are alternately distributed, a length of the end portion arranged in the suspended manner in the first doped semiconductor layer is less than or equal to 3000 nm.

3. The back contact solar cell according to claim 1, wherein in the side wall of the groove structure, a partial surface close to a groove opening is arranged perpendicular to the horizontal plane.

4. The back contact solar cell according to claim 3, wherein at least a partial surface in the side wall of the groove structure is arranged obliquely relative to the horizontal plane at an angle greater than or equal to 52° and less than or equal to 58°.

5. The back contact solar cell according to claim 1, wherein along a direction that the first regions and the second regions are alternately distributed:

a length of the planar surface arranged parallel to the horizontal plane in the side wall of the groove structure is less than 2 μm, and a minimum distance between the planar surface arranged parallel to the horizontal plane in the side wall of the groove structure and the groove opening of the groove structure is greater than 0 and less than 1 μm.

6. The back contact solar cell according to claim 1, wherein at least a partial surface of a groove bottom of the groove structure is a textured surface.

7. The back contact solar cell according to claim 1, wherein the back contact solar cell further comprises a second doped semiconductor layer formed on the groove structure, wherein a conductivity type of the second doped semiconductor layer is opposite to a conductivity type of the first doped semiconductor layer.

8. The back contact solar cell according to claim 7, wherein the back contact solar cell further comprises:

a first passivation layer between the first region and the first doped semiconductor layer, wherein the first passivation layer is a tunneling passivation layer and the first doped semiconductor layer is a doped polysilicon layer; and a second passivation layer between the silicon substrate and the second doped semiconductor layer.

9. The back contact solar cell according to claim 7, wherein the groove structure has a gap between the first doped semiconductor layer and the second doped semiconductor layer along a direction that the first regions and the second regions are alternately distributed, and wherein the surface of the second doped semiconductor layer does not extend to be suspended at a side wall close to the second doped semiconductor layer.

10. The back contact solar cell according to claim 8, wherein the second passivation layer is a tunneling passivation layer, and the second doped semiconductor layer is a doped polysilicon layer.

11. The back contact solar cell according to claim 9, wherein the gap between the first doped semiconductor layer and the second doped semiconductor layer is greater than or equal to 20 μm and less than or equal to 110 μm.

\* \* \* \* \*